United States Patent [19]

Devine

[11] 4,266,184
[45] May 5, 1981

[54] METHOD AND APPARATUS FOR TESTING INSULATORS

[76] Inventor: Clifford W. Devine, Box 123, Keremeos, British Columbia, Canada, V0X 1N0

[21] Appl. No.: 48,579

[22] Filed: Jun. 15, 1979

[51] Int. Cl.³ .................................................. G01R 31/12
[52] U.S. Cl. ......................................... 324/54; 324/72.5; 324/111
[58] Field of Search .............. 324/54, 72, 123 R, 72.5, 324/149, 111

[56] References Cited

U.S. PATENT DOCUMENTS

| | | | |
|---|---|---|---|
| 1,644,421 | 10/1927 | Doble | 324/72.5 |
| 1,775,530 | 9/1930 | Jansson | 324/54 |
| 1,923,565 | 8/1933 | Austin | 324/54 |
| 1,943,391 | 1/1934 | Paine et al. | 324/54 |
| 2,889,395 | 6/1959 | Frakes | 324/54 |
| 2,923,879 | 2/1960 | Povey | 324/54 |
| 3,363,172 | 1/1968 | Doble | 324/54 |
| 3,439,263 | 4/1969 | Broyles | 324/149 |

Primary Examiner—Michael J. Tokar
Attorney, Agent, or Firm—Arne I. Fors; Robert F. Delbridge

[57] ABSTRACT

A method and apparatus are described for detecting faulty insulators used on overhead power transmission lines. The apparatus comprises two contact probes, a capacitance, a blocking resistance and a direct current meter in series between the probes to form an open electrical circuit. Means are provided to prevent discharging of the capacitance while the capacitance is being charged. In the use of the apparatus, the capacitance is charged from a source of high voltage direct current, the discharging of the capacitance to the source is avoided, the contact probes are sequentially applied across insulators and any current flowing across the insulators is recorded by the direct current meter. The sequential application of the contact probes is carried out while the insulators remain in service and the transmission line remains fully energized. The value of the capacitance is such that a large number of insulators can be tested before recharging becomes necessary. The value of the resistance is such that a blocking effect exists which causes a current of only a few micro amperes to pass through the current meter when testing a faulty insulator and thus avoids a rapid discharging of the capacitance.

11 Claims, 1 Drawing Figure

U.S. Patent May 5, 1981 4,266,184
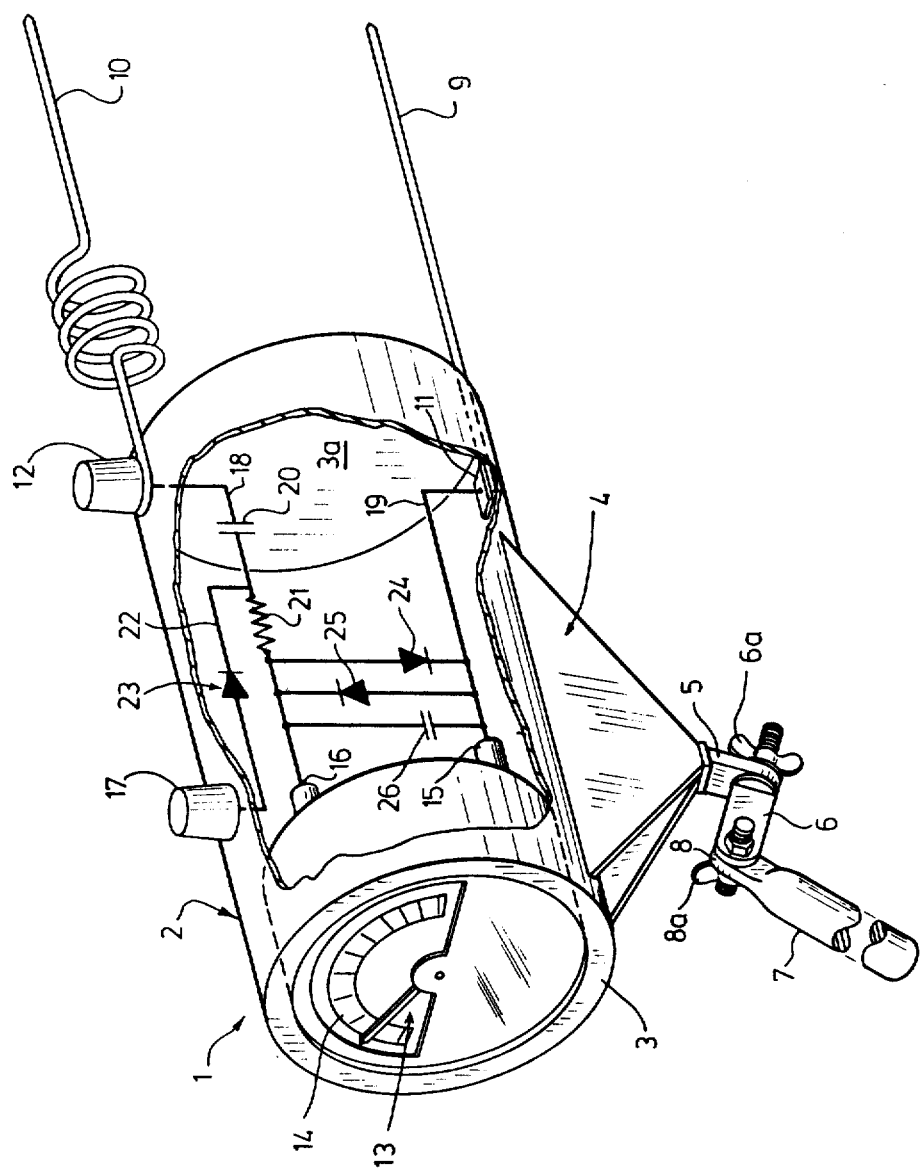

METHOD AND APPARATUS FOR TESTING INSULATORS

This invention relates to a method and apparatus for testing insulators and, more particularly, to a method and a testing device for detecting faulty insulators used on overhead power transmission lines.

In the transmission of electrical power, transmission lines are supported or suspended from poles or towers by means of insulators made of dielectric materials such as porcelain, glass or other suitable material. These insulators are usually connected in strings of two or more individual insulators. The insulators tend to deteriorate over a period of time, particularly as a result of the combined effects of changes in temperature and humidity. It is, therefore, necessary to periodically check the insulators so that defective insulators may be detected and subsequently replaced.

Many methods and apparatus have been developed in the past to detect faulty insulators. One such method and apparatus is disclosed in U.S. Pat. No. 1,923,565. According to this patent, a forked probe is positioned across an insulator, a direct current, generated by a D.C. (direct current) generator (called a Megger), is applied to the insulator and the flow of current across a fault in the insulator is detected and shown on a current indicator. The method and apparatus according to this patent have several disadvantages. The transmission line must be de-energized during the testing to avoid placing a high voltage on the test equipment and to ensure the safety of the personnel that carry out the testing. A separate source of power such as, for example, a battery must be used, in addition to using a Megger, to energize the primary induction coil of the transformer which forms part of the apparatus.

According to U.S. Pat. No. 1,943,391, insulation may be tested by impressing a potential sufficient to cause disturbance currents in inhomogeneities in the insulation which are measured. According to U.S. Pat. No. 2,281,470, apparatus for measuring high electrical resistance comprises a source of D.C., a rectifier to pass current flowing from the D.C. source through the resistance to be measured and an instrument for measuring the current from the source to the resistance through the rectifier. The apparatus measures the resistance of a device and can not be used to detect faulty insulators on power transmission lines. According to U.S. Pat. No. 2,239,598, grounded insulation is tested by applying an A.C. voltage and measuring current or capacitance. According to U.S. Pat. No. 2,923,879, insulators are tested by impressing an alternating voltage across an insulator and measuring the difference between two voltages which represents the resistive component of current through the insulator. According to U.S. Pat. No. 3,363,172 grounded insulators are tested by applying a test voltage and measuring the current flowing through the insulator; the testing means include a transformer and a grounded lead. Most of these disclosures involve grounding the insulator or applying an A.C. voltage.

I have now found that insulators on overhead power transmission lines can be tested quickly, safely and conveniently while the insulators remain in service and the power line remains fully energized with its normal operating A.C. voltage. The tester utilizes a light-weight, high voltage, capacitance as an energy source in its measuring circuit. Thus, the tester comprises a built-in power supply and the energy stored in the high voltage capacitance bleeds through a high blocking resistance so that a large number of insulators can be tested in situ before the device needs to be recharged. The method of testing comprises applying a high D.C. potential to pre-charge a high voltage capacitance while preventing the capacitance from discharging, applying a D.C. potential from the pre-charged capacitance for a limited period of time to an insulator and recording any current flow through the insulator on a D.C. meter while protecting the meter from the high A.C. voltage of the power line. The testing means comprises a self-contained source of D.C., means for preventing the discharge of the D.C. source while charging said source, two probes, a D.C. meter and means to protect the D.C. meter from high alternating voltage.

More specifically, there is provided a method for detecting faulty insulators among insulators supporting high alternating voltage power transmission lines by means of high voltage direct current and testing means comprising a capacitance, a blocking resistance, means to avoid discharge of said capacitance, contact probes and a direct current meter which comprises the steps of connecting a source of high voltage direct current to said testing means, charging said capacitance consisting of at least one high voltage, oil filled capacitor from said source, avoiding discharging of the charged capacitor to said source, disconnecting said source from the testing means whereby said testing means have a self contained source of high voltage direct current, sequentially applying the contact probes of said testing means across insulators and recording any current flowing across said insulators by means of said meter, any recorded current being indicative of a faulty insulator, and carrying out the sequential application of the contact probes across insulators while said insulators remain in service and the power transmission lines remain fully energized with normal operating alternating current voltage. Furthermore, there is provided a testing apparatus for detecting faulty insulators on power transmission lines carrying high alternating voltage comprising two contact probes, a capacitance, a blocking resistance and means to measure a direct current connected in series between said contact probes to form an open electrical circuit, two charging leads connected across said capacitance for applying a high voltage direct current to said charging leads, and means positioned in one of said charging leads to prevent discharging of said capacitance while a high voltage direct current is applied to said charging leads.

The invention will now be described with reference to the accompanying drawing, a portion of which has been cut away to schematically illustrate the electric circuit means which form part of the apparatus of the invention.

The tester generally indicated at 1 is contained in a housing consisting of a cylindrical tube case 2 closed at both ends by parallel end discs 3 and 3a. A generally V-shaped base mount 4 is attached to or may form an integral part with cylindrical tube case 2. Tube case 2, end discs 3 and 3a, as well as base mount 4 are made of an electrically non-conductive material. Attached to the bottom of the V of base mount 4 is a lug 5 and a connector 6 pivotally secured to lug 5 by fastening means such as a wing nut 6a.

An insulating stick, generally indicated at 7, which has lug 8 at one end thereof, is pivotally attached to the opposite end of connector 6 by fastening means such as wing nut-bolt 8a. Fastening means 6a and fastening means 8a, when attached to each other, form a double swivel joint which gives a tight connection between the stick and the tester at any desired angle. When the tester is in use, the insulating stick 7 is rigidly attached to the tester and serves as an extension to enable positioning of the tester at the insulators to be tested. The insulating stick, which is standard in the industry, is usually about 2 to 4 m long and will also permit the lineman to keep away from sources of high voltage. The housing of the tester, its base mount and the insulating stick are made of an insulating material, such as, for example, glass fiber.

Two metal contact probes 9 and 10 are positioned in opposite spaced relationship on the outside of tube case 2 next to end disc 3a by means of similarly spaced metal fastening means 11 and 12, respectively. The contact probes, which are made of a conductive metal such as steel, should be of sufficient length to reach across the insulator. The contact probes may have different shapes and may be made interchangeable to suit different types or sizes of insulators to be tested. As shown in the drawing, contact probe 9 is straight and contact probe 10 has a spiralled portion, which provides a degree of flexibility when making contact across an insulator, ensuring good contact. Alternatively, probe 9 may be of a U-shaped configuration. The probes may have a bent portion (not shown) formed in such a manner that fastening of the probes on the tube case 2 can be made at two points by means of additional fastening means (not shown) for added rigidity. It is noted that fastening means 11 containing probe 9 is insulated from fastening means 12 containing probe 10 by virtue of their being spaced apart and the insulating properties of the material of the tube case 2 and end disc 3a.

A D.C. micro ammeter 13 is mounted centrally in end disc 3, the dial 14 of meter 13 being approximately flush with the surface of the disc. The meter has 2 terminals 15 and 16 for connecting of leads. The measuring range of the meter should be sufficient to indicate the currents that flow through defective insulators and chosen with regard to the values and rating of the capacitance 20 and resistance 21. A range of 0 to 200 $\mu$A is generally considered adequate.

A charging terminal 17, to which a lead from a charging device can be attached, is mounted on tube case 2 opposite base mount 4. Charging terminal 17 serves as the positive terminal while the negative terminal for the charging device is combined with fastening means 12. The charging device, which is used to provide a D.C. charge for the tester, is a D.C. power source with a rating in the range of 0.5 to 10 kV.

Turning now to the electrical circuit, which is schematically indicated, a first wire 18 connects negative terminal and fastening means 12 containing probe 10 with terminal 16 of meter 13 and a second wire 19 connects fastening means 11 containing probe 9 with terminal 15 of meter 13. Wire 18 contains a capacitance 20 and a resistance 21, in series, resistance 21 being situated closest to terminal 16. A charging lead 22 connects charging terminal 17 with wire 18 at a point situated between capacitance 20 and resistance 21.

The capacitance 20 is a single high voltage, oil filled capacitor of a given value, or a number of high voltage, oil filled capacitors arranged in parallel which have a total value equal to the value of the single capacitor. The value of the capacitance should be sufficiently high so that a large number of defective insulators can be detected before recharging becomes necessary. The value of the capacitance should be at least 0.02 $\mu$F, and should preferably be in the range of about 0.02 to 0.20 $\mu$F. The voltage rating of the capacitance should be in the range of about 1 to 10 kV. Similarly, the resistance 21 is a single resistor of a given value, or a number of resistors arranged in series which have a total value equal to the value of the single resistor. Preferably, a number of resistors, which are joined end to end in series, are used to create a string of resistors for better isolation in the high D.C. voltage circuit. The value of the resistance should be at least such that a short circuit between probes 9 and 10 results in a current flow that will cause not more than a full-scale deflection on scale 14 of meter 13. The value of the resistance must be high so that a blocking effect exists which causes a low current of only a few micro amperes to pass through current meter 13 when testing a defective insulator and thus to avoid a rapid discharging of capacitance 20. For example, a resistance value of at least 2.5 M$\Omega$, preferably in the range of about 2.5 to 200 M$\Omega$, is satisfactory to obtain a deflection on scale 14 of meter 13 and a slow discharging of the capacitance 20 in case of a defective insulator. The rating of the resistance should be in the range of 0.25 to 2 W.

In charging lead 22 is positioned a forwardly biased diode 23 which allows the charging of capacitance 20 but which prevents capacitance 20 from discharging. This diode is essential to allow the tester to be charged only in one direction guaranteeing correct polarity and to eliminate discharge of the tester (capacitance) due to a short across the charging terminals 17 and 12. The presence of the diode also simplifies the charging procedure, for example by using a Megger, making it unnecessary to continue the charging while the charging leads from the charging device are being disconnected.

Micro ammeter 13 is a standard D.C. meter. The meter should be protected against the high alternating voltage of the power transmission line by means of a protective circuit. Such protective circuit may include two bypass diodes 24 and 25 and a capacitance 26 which are placed in parallel across terminals 15 and 16 of the meter and between wires 18 and 19. Bypass diode 24 is forwardly biased and bypass diode 25 is reversely biased which allows A.C. to bypass the D.C. meter, with A.C. flow through bypass diode 24 for half of the A.C. cycle and through bypass diode 25 for the other half of the cycle. The capacitance 26, which is preferably a ceramic disc capacitor, allows any high frequency R.F. signal to bypass the meter. The protective circuit is a standard circuit, which alternatively, may be included with meter 13.

In the use of the tester, the insulating stick 7 is firmly attached at the appropriate angle to the tester by means of lug 8 with fastening means 8a of stick 7 and fastening means 6a of connector 6 secured to lug 5. A direct current generator (not shown), such as a Megger, is connected with its leads (not shown) to charging terminals 17 and 12, observing the correct polarity. Capacitance 20 is charged by operating the generator and when a full charge is obtained the generator is disconnected by removing its leads from charging terminals 17 and 12. The tester is now ready to test insulators. The contact probes 9 and 10 are applied across an insulator for a short period of time. If an insulator is good, the resistance of the insulator is extremely high, current flow is substantially zero and no reading is observed on scale 14 of meter 13. If an insulator is defective, the resistance will be lower, a current will flow through the insulator and a reading is observed on scale 14, the reading on scale 14 being indicative of the degree of defectiveness of the insulator.

The D.C. potential applied by the tester has no effect on the A.C. circuit of the power transmission line. Similarly, the A.C. voltage of the power line has negligible effects on the tester. This is the result of a proper choice of the values and ratings of the components of the tester which gives its circuit an extremely long time constant. Thus, the capacitor(s) of capacitance 20 has/have no chance to charge up in each half of the cycles of the 60 Hz A.C. voltage, no matter what the value of this voltage may be. A contact period of the probes across the insulator of only a few seconds, for example 2 to 5 seconds, is sufficient to obtain an indication of the condition of the insulator. A longer contact period results in unnecessary loss of charge of the capacitance in case of defective insulators. As the charge of the capacitance can be considerable and the loss of charge by current flow through defective insulators can be very low, a fully charged capacitance can be used to detect many defective insulators. After testing is completed, any residual charge may be discharged by placing a conductive path between the probes; the meter 13 will indicate a flow of current until the tester is discharged.

It is understood that the tester can be used to check all types of insulators used to suspend or support electrical conductors. These include string insulators, suspension insulators, pin-type insulators, station bus insulators, switch insulators and transformer bushings which can be accommodated when different, interchangeable contact probes are used with the tester.

In the specific and preferred embodiment of the invention the following values for the components of the tester and generator have given excellent results in the testing of insulators on power transmission lines under full operating load and have made it possible to detect up to 50 defective insulators before recharging the tester. A 5 kV Megger was used to charge capacitance 20, which consisted of 7 oil filled capacitors in parallel of 0.02 $\mu$F at 10,000 W.V.D.C. (Working voltage direct current) each, for a total capacitance of 0.14 $\mu$F with a rating of 10 kV. Resistance 21 consisted of 10 resistors connected end to end in series of 10 M$\Omega$ each for a total resistance of 100 M$\Omega$ and a rating of 0.5 W over a length of 12 cm. The diode 23, which eliminates discharge of capacitance 20 due to a short across charging terminals 17 and 12, i.e. the Megger, had a rating of 6.5 kV. The micro ammeter was a 0 to 50 $\mu$A D.C. meter with a protective circuit as described hereinabove wherein bypass diodes 24 and 25 had a rating of 1 kV and 1 A, and ceramic disc capacitance 26 had a value of 0.02 $\mu$F. All components were either soldered together or connected by high voltage wire with a rating of 40 kV working voltage and 110 kV breakdown voltage. All connections and joints were covered by heat shrink material.

In the use of the tester according to the preferred embodiment, the tester was charged and subsequently applied to 126 insulators, arranged in strings of 6 60 kV, overhead power transmission line for periods of application to single insulators of about 2 seconds. 46 defective insulators, i.e. a deflection of the needle of the current meter was observed, were detected. The testing was carried out by two operators travelling along the power line, one operator carrying out the testing. Subsequently, the power line was shut down and all the tested insulators were replaced. The removed insulators were then tested in a warehouse and submitted to the conventional test. The results of the "in service" test corresponded with those of the conventional test, i.e. a 100% accuracy. The same reliability of the method and apparatus according to the invention was obtained when insulators on a 230 kV power line were tested.

It will be understood of course that modifications can be made in the embodiment of the invention illustrated and described herein without departing from the scope and purview of the invention as defined by the appended claims.

What I claim as new and desire to protect by Letters Patent of the United States is:

1. A method for detecting faulty insulators among insulators supporting high alternating voltage power transmission lines by means of testing means comprising a capacitance, a blocking resistance, means to avoid discharge of said capacitance, contact probes and a direct current meter which comprises the steps of connecting a source of high voltage direct current to said testing means, charging said capacitance consisting of at least one high voltage, oil filled capacitor from said source, avoiding discharging of the charged capacitor to said source, disconnecting said source from the testing means whereby said testing means has a self contained source of high voltage direct current, sequentially applying the contact probes of said testing means across insulators and recording any current flowing across said insulators by means of said meter, any recorded current being indicative of a faulty insulator, and carrying out the sequential application of the contact probes across insulators while said insulators remain in service and the power transmission lines remain fully energized with normal operating alternating current voltage.

2. A testing apparatus for detecting faulty insulators on power transmission lines carrying high alternating voltage comprising: two contact probes; a capacitance, a blocking resistance and means to measure a direct current connected in series between said contact probes to form an open electrical circuit; two charging leads connected across said capacitance for applying a high voltage direct current to said charging leads, and means positioned in one of said charging leads to prevent discharging of said capacitance while a high voltage direct current is applied to said charging leads.

3. A testing apparatus as claimed in claim 2, wherein said blocking resistance is located in series between the capacitance and said means to measure a direct current and one of said charging leads is connected between the capacitance and the blocking resistance.

4. A testing apparatus as claimed in claim 3, wherein said means to prevent discharging of said capacitance is a forwardly biased diode in said charging lead connected between the capacitance and the blocking resistance.

5. A testing apparatus as claimed in claim 2, 3 or 4, wherein said capacitance comprises one high voltage oil filled capacitor or more than one capacitor connected in parallel, said capacitance having a value in the range of about 0.02 to 0.20 $\mu$F and having a rating in the range of about 1 to 10 kV.

6. A testing apparatus as claimed in claim 2, 3 or 4, wherein said capacitance comprises one high voltage oil filled capacitor or more than one capacitor connected in parallel, said capacitance having a value of about 0.14 $\mu$F and having a rating of about 10 kV.

7. A testing apparatus as claimed in claim 2, 3 or 4, wherein said blocking resistance comprises one resistor or more than one resistor connected in series, said resistance having a value in the range of about 2.5 to 200 MΩ and a rating in the range of about 0.25 to 2 W.

8. A testing apparatus as claimed in claim 2, 3 or 4, wherein said blocking resistance comprises one resistor or more than one resistor connected in series, said resistance having a value of about 100 MΩ and a rating of about 0.5 W.

9. A testing apparatus as claimed in claim 2, 3 or 4, wherein said means for preventing discharging of said capacitance is a forwardly biased diode having a rating of 6.5 kV.

10. A testing apparatus as claimed in claim 2, 3 or 4, wherein said means for measuring direct current has a protective circuit to protect said means against the high alternating voltage of the power transmission lines.

11. A testing apparatus as claimed in claim 2, 3 or 4, wherein said means for measuring direct current has a protective circuit to protect said means against the high alternating voltage of the power transmission lines which comprises a forwardly biased bypass diode, a reversely biased bypass diode and a ceramic disc capacitor, said diodes and capacitor connected in parallel across the terminals of the means for measuring direct current.

* * * * *